United States Patent [19]
Yanagisawa

[11] Patent Number: 5,290,711
[45] Date of Patent: Mar. 1, 1994

[54] METHOD FOR FABRICATING SEMICONDUCTOR DEVICES WHICH LESSENS THE EFFECT OF ELECTROSTATIC DISCHARGE

[75] Inventor: Masayuki Yanagisawa, Tokyo, Japan

[73] Assignee: NEC Corporation, Tokyo, Japan

[21] Appl. No.: 53,366

[22] Filed: Apr. 28, 1993

[30] Foreign Application Priority Data

Apr. 28, 1992 [JP] Japan .................... 4-109410

[51] Int. Cl.⁵ .................... H01L 21/265; H01L 23/60
[52] U.S. Cl. .......................... 437/20; 437/48; 437/206
[58] Field of Search .............. 437/7, 8, 15, 20, 48, 437/51, 206, 228, 957, 941; 148/DIG. 45, DIG. 162

[56] References Cited

U.S. PATENT DOCUMENTS

| | | | |
|---|---|---|---|
| 4,139,935 | 2/1979 | Bertin et al. | 437/12 |
| 4,258,077 | 3/1981 | Mori et al. | 437/20 |
| 4,883,543 | 11/1989 | Gossen, Jr. | 437/37 |
| 5,015,600 | 5/1991 | Livermore et al. | 437/206 |
| 5,079,609 | 1/1992 | Takagi | 437/20 |

Primary Examiner—Brian E. Hearn
Assistant Examiner—Chandra Chaudhari
Attorney, Agent, or Firm—Sughrue, Mion, Zinn, Macpeak & Seas

[57] ABSTRACT

In a method for fabricating a semiconductor device of the present invention, photoresist layers are not formed on a scribe line regions entirely. Therefore, electric charge can be transferred from device regions to out of a wafer by surface conduction, when impurity layers are formed on a substrate by ion implantation.

8 Claims, 10 Drawing Sheets

METHOD FOR FABRICATING SEMICONDUCTOR DEVICES WHICH LESSENS THE EFFECT OF ELECTROSTATIC DISCHARGE

FIELD OF THE INVENTION

This invention relates to a method for fabricating semiconductor devices, and more particularly, to a method for fabricating semiconductor devices which are separated from each other by a scribe line.

BACKGROUND OF THE INVENTION

Recently, a plurality of semiconductor devices are fabricated, being separated from each other by a scribe line region, on a wafer.

In fabrication, a field oxide layer is formed on a p-silicon substrate whereby a plurality of device regions and a scribe line region are formed on the substrate. Then, a photoresist layer is formed on the scribe line region entirely, and an n-impurity layer is formed on the substrate by an ion implantation using the photoresist layer as a mask. After that, the photoresist layer is removed, and a p-impurity layer is formed on the p-silicon substrate. Next, an interconnection line is formed on a periphery portion of the scribe line region entirely, whereby the interconnection line is connected through the p-impurity layer to the substrate.

According to the conventional method for fabricating semiconductor devices, however, there is a disadvantage in that electric charge which is generated by ion implantation is accumulated in the device regions, because the scribe line region is covered with the photoresist layer when ion implantation is carried out to form the n-impurity layer on the substrate. Therefore, the electric charge can not be transferred through a surface of the substrate due to low surface conduction by the encircling photoresist layers, whereby electrostatic discharge occurs in the device regions. As a result, semiconductor devices to be fabricated on the wafer may be broken by the electrostatic discharge.

SUMMARY OF THE INVENTION

Accordingly, it is an object of the invention to provide a method for fabricating semiconductor devices by which the surface conduction is not interrupted to avoid the excess accumulation of charge, so that semiconductor devices to be fabricated on a wafer are not broken by electric discharge occurring based on an ion-implantation process.

According to the invention, a method for fabricating semiconductor devices includes the steps of:

defining device regions and scribe line regions on a semiconductor substrate, each of the device regions being surrounded by the scribe line regions;

providing a photoresist layer on selected areas of the scribe line regions;

implanting ions into remaining areas of the semiconductor substrate, the remaining areas being not covered with the photoresist layer;

removing the photoresist layer from the semiconductor substrate; and providing an interconnection layer on the scribe line regions, the interconnection layer being in contact via the selected areas with the semiconductor substrate.

The other objects and features of the invention will become understood from the following description with reference to the accompanying drawings.

DESCRIPTION OF THE PREFERRED EMBODIMENTS

For better understanding of the background of the present invention, the basic principle of the conventional technology is first described hereinafter with reference to FIGS. 1 to 7.

Figure 1:
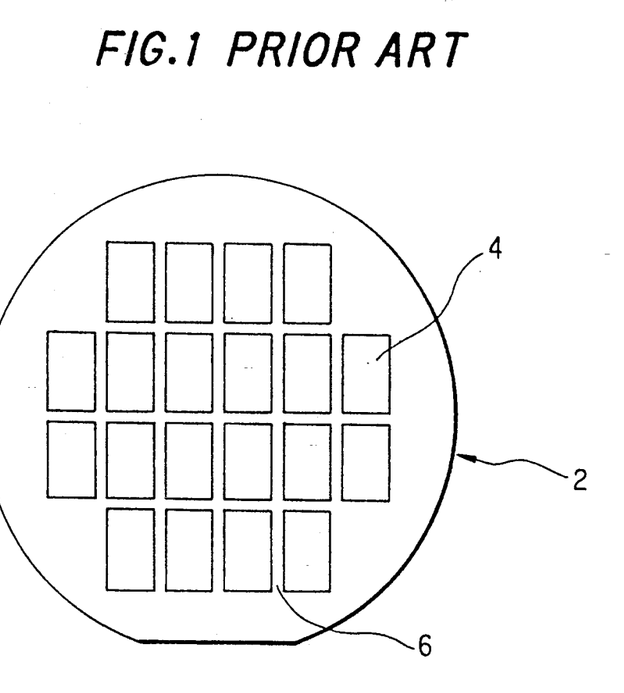
FIG. 1 is a plane view showing a conventional wafer.

FIG. 1 shows a conventional wafer 2 used for fabricating a plurality of semiconductor devices by a conventional method. The wafer 2 includes a plurality of device regions 4 and a scribe line region 6 for separating the device regions 4 from each other.

Figure 2:
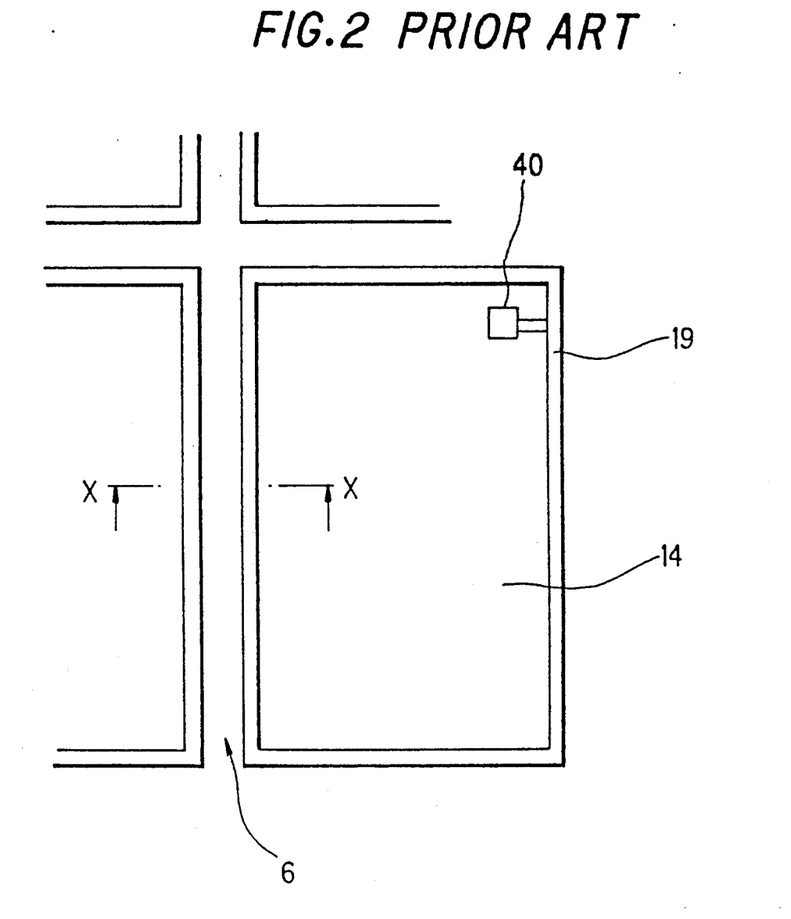
FIG. 2 is an enlarged plane view showing a part of the wafer shown in FIG. 1.
Figure 3:
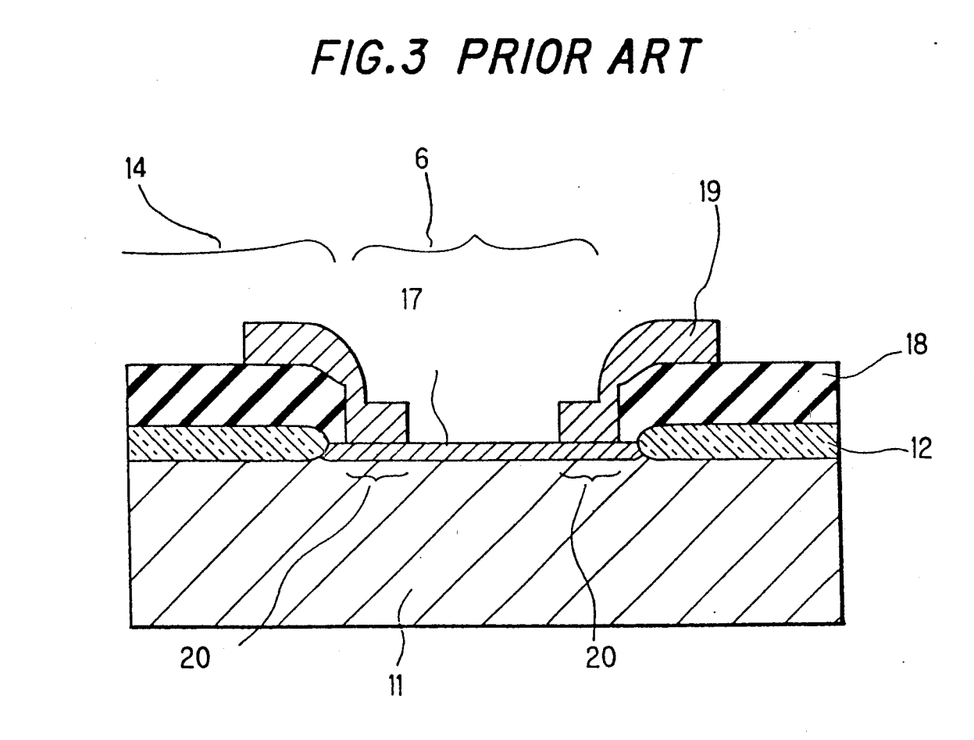
FIG. 3 is a cross sectional view taken on line X—X in FIG. 2.

FIGS. 2 and 3 show a part of the wafer 2. The wafer 2 includes a p-silicon substrate 11, a field oxide layer 12 formed on the p-silicon substrate to have a thickness of 0.6 $\mu$m, a p-impurity layer 17 formed on the p-silicon substrate 11, a boron phosphorus silicate glass (BPSG) layer 18 formed on the field oxide layer 12 to have a thickness of 1 $\mu$m, and an aluminum interconnection layer 19 formed on periphery portion of the scribe line region 6 to have a thickness of 1 $\mu$m.

The aluminum interconnection layer 19 is connected to a substrate bias generating circuit 40 whereby a substrate is maintained at a bias by the substrate bias generating circuit 40 through the aluminum interconnection layer 19.

Figure 4:
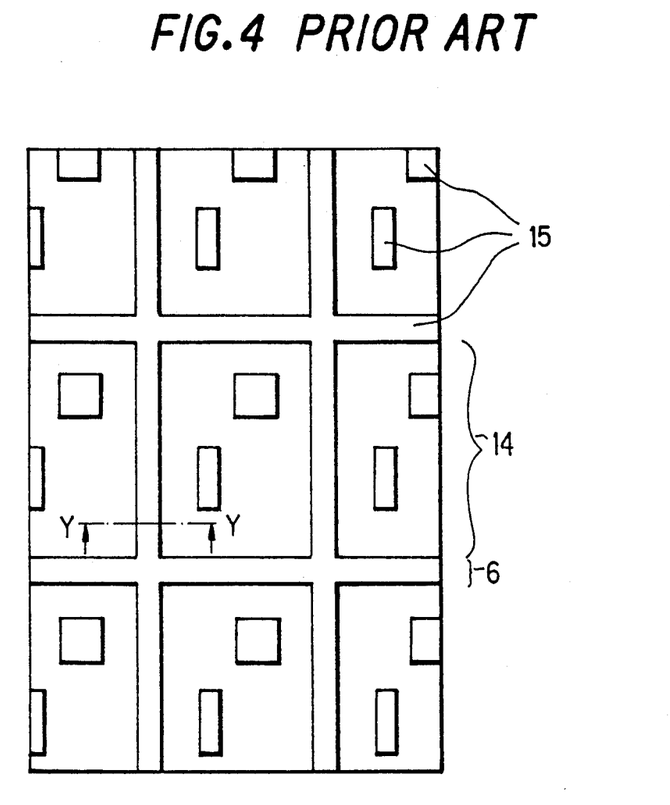
FIG. 4 is a plane view showing a resist pattern used for a conventional method.
Figure 5:
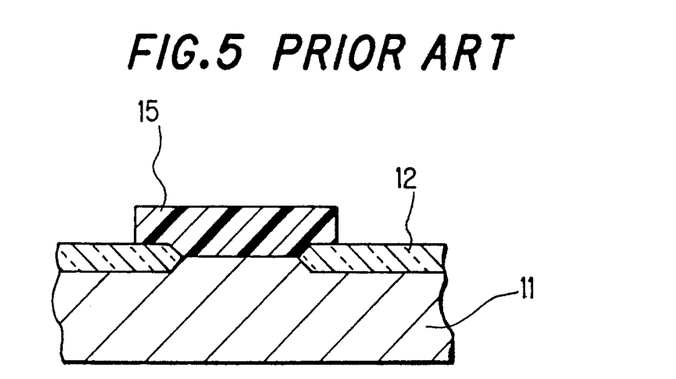
FIG. 5 is a cross sectional view taken on line Y—Y in FIG. 4.

In fabrication, the field oxide layer 12 is formed on the p-silicon substrate 11, and a photoresist layer 15 is formed on the whole of the scribe line region 6 as shown in FIGS. 4 and 5. Then, an n-impurity layer (not shown) is formed at the device regions 14 by ion implantation using the photoresist layer 15 as a mask. After that, the photoresist layer 15 is removed, the p-impurity layer 17 is formed on the p-silicon substrate 11. Next, the BPSG layer 18 is formed on a surface of the substrate thus processed, and the BPSG layer 18 locating above the scribe line region 6 is removed. And, then the aluminum interconnection layer 19 is formed on the substrate thus processed to cover the edge portions of the device regions 14, whereby the aluminum interconnection layer 19 is connected through the p-impurity layer 17 to the p-silicon substrate 11.

Figure 6:
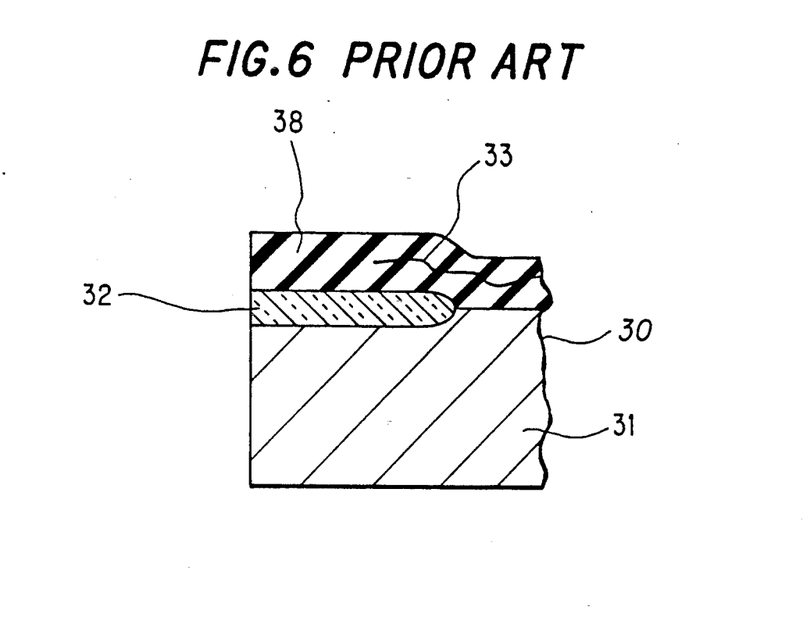
FIGS. 6 and 7 are cross sectional views showing other conventional semiconductor devices, respectively.

As described above, according to the conventional method for fabricating semiconductor devices, there are advantages in that no crack occurs in the BPSG layer 18 because the BPSG layer 18 locating above the scribe line region 6 is removed before a dicing process. That is, if a BPSG layer 38 is not removed at a scribe line region as shown in FIG. 6, a crack 33 occurs in the BPSG layer 38 when a dicing process is carried out, the crack 33 extending from a dicing face 30 to a device region. The crack 33 causes semiconductor devices to have low reliability as to a moisture resistance and the like. In FIG. 6, numerals "31" and "32" indicate a p-silicon substrate and a field oxide layer, respectively.

Figure 7:
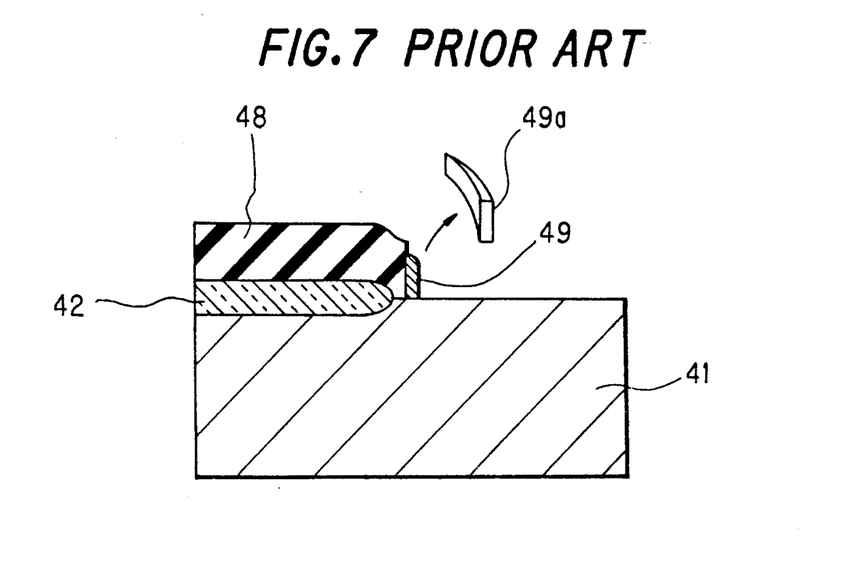

Further, a short circuit failure tends to occur between interconnections on semiconductor devices to be fabricated by a peeled segment 49a of an aluminum film 49, as shown in FIG. 7. That is, if no aluminum interconnection layer is formed on the edge portion of the BPSG layer 18, an aluminum film 49 is left on that portion, when an anisotropic dry-etching is carried out for an aluminum film provided on device regions to provide a pattern of aluminum interconnections. When the left aluminum film 49 is peeled off, a short circuit failure is resulted between interconnections in the device region by the peeled aluminum film segment 49a. In this figure, numerals "41" and "42" indicate a p-silicon substrate and a field oxide layer, respectively.

Furthermore, a substrate bias can be applied from the substrate bias generating circuit 40 through the aluminum interconnection layer 19 to the device regions 14, because the aluminum interconnection layer 19 is formed on the scribe line region 6. Therefore, its own interconnection line is not required for a substrate bias, and a stable bias can be applied to the device regions 14.

According to the conventional method for fabricating semiconductor devices, however, there is a disadvantage in that electric charge generated by the ion implantation for the n-impurity layer is accumulated in the device regions 14, so that the electric charge can not be transferred to the outside of the wafer due to low surface conduction by encircling photoresist films, as mentioned before.

Next, a method for fabricating semiconductor devices of a first preferred embodiment according to the invention will be explained in conjunction with FIG. 8, FIGS. 9A and 9B, FIG. 10 and FIGS. 11A and 11B.

Figure 8:
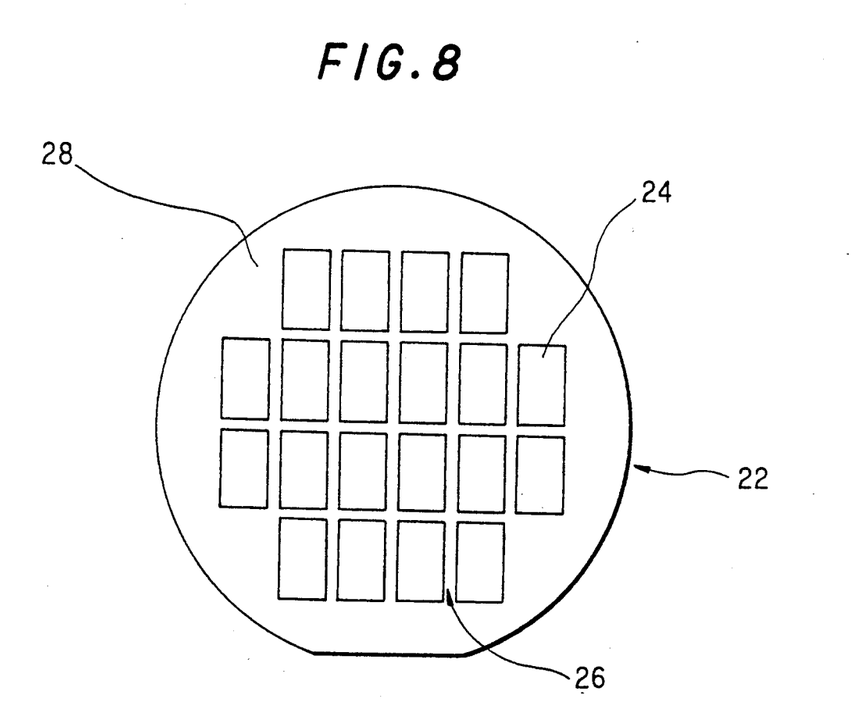
FIG. 8 is a plane view showing a wafer of a first preferred embodiment according to the invention.

FIG. 8 shows a wafer 22, which includes a plurality of usable device regions 24 arranged in matrix, a scribe line region 26 separating the plurality of usable device regions 24 from each other, and a non-usable region 28.

Figure 9A:
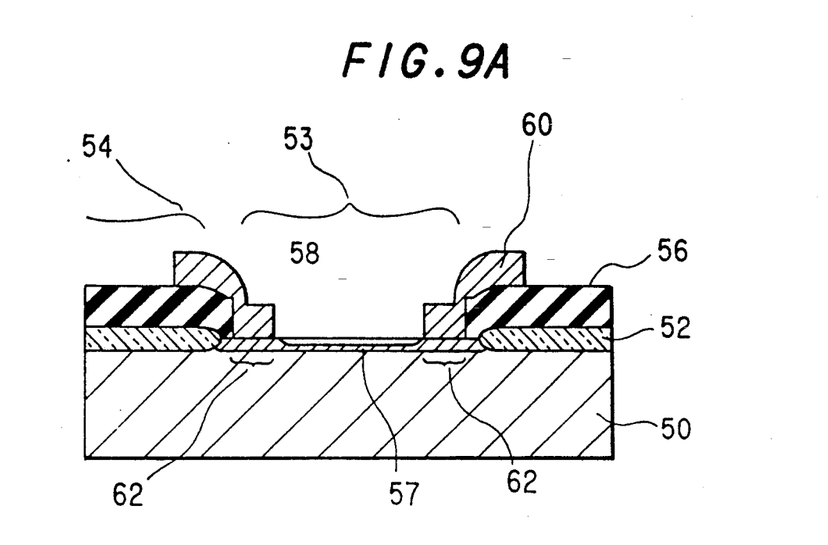
FIGS. 9A and 9B are cross sectional views showing scribe line regions of the first preferred embodiment, respectively.
Figure 9B:
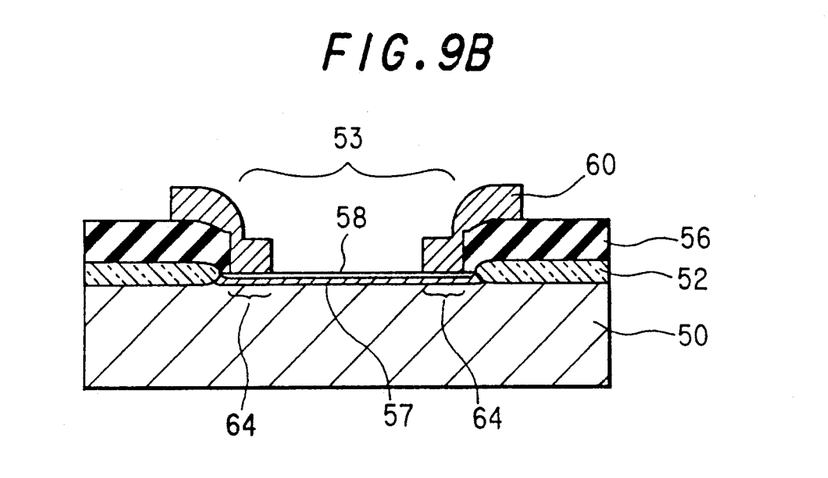

FIGS. 9A and 9B show two distinct cross-sections of the wafer 22 used in the method for the first preferred embodiment, respectively, wherein the first cross-section has a connection region 62 (FIG. 9A) which is not implanted with n-impurities by photoresist layer (to be explained later), and the second cross-section has a connection region 64 (FIG. 9B) which is implanted with n-impurities due to the non-provision of photoresist layer (to be also explained later).

The wafer 22 includes a p-silicon substrate 50, a field oxide layer 52 formed on the p-silicon substrate 50 to have a thickness of 0.6 μm, a p-impurity layer 57 formed on the p-silicon substrate 50, a n-impurity layer 58 formed on the p-silicon substrate 50 to have a depth of 0.2 μm, a boron phosphorus silicate glass (BPSG) layer 56 formed on the field oxide layer 52 to have a thickness of 1 μm, and an aluminum interconnection layer 60 formed on periphery portion of the scribe line region 53 to have a thickness of 1 μm.

Figure 10:
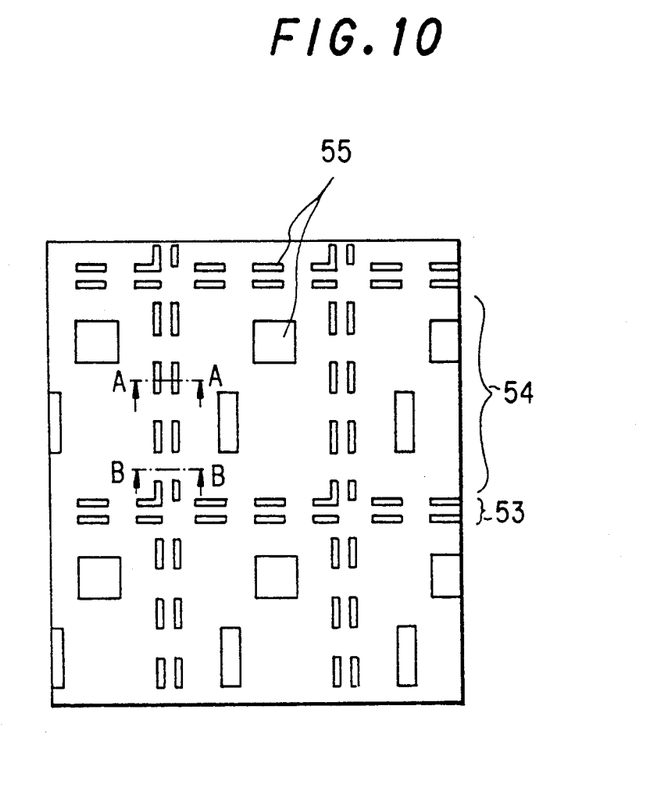
FIG. 10 is a plane view showing a resist pattern used for a method of the first preferred embodiment according to the invention.
Figure 11A:
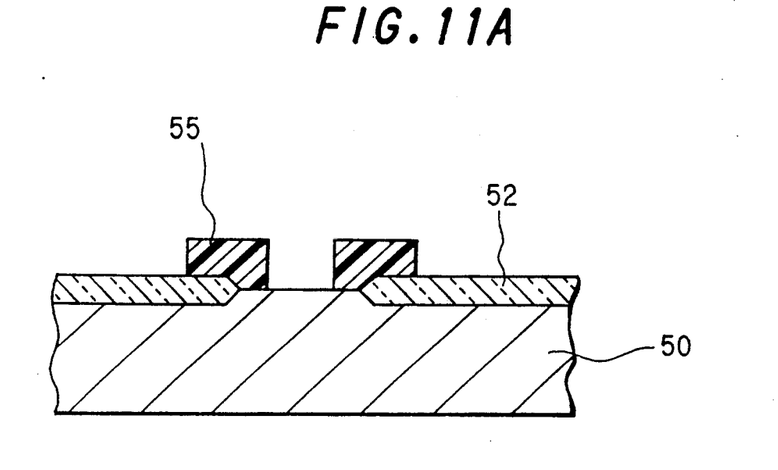
FIGS. 11A and 11B are cross sectional views taken on lines A—A and B—B in FIG. 10, respectively.
Figure 11B:
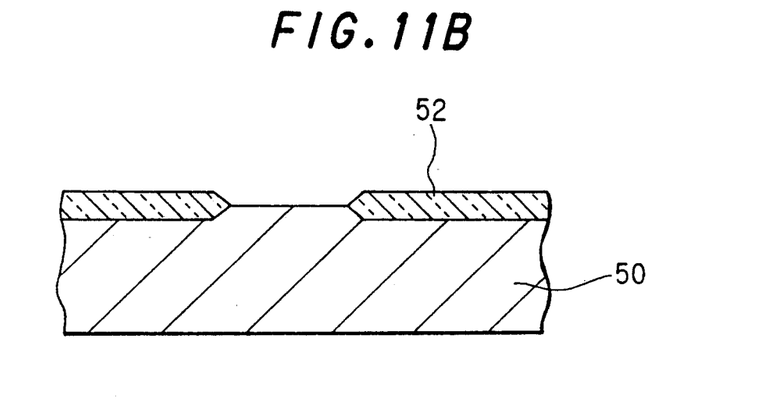

In fabrication, the field oxide layer 52 is formed on the p-silicon substrate 50 to define the device regions 54 on the wafer 22, such that the scribe line region 53 is defined between the device regions 54. Then, a photoresist layer 55 is formed on the substrate thus processed to have a pattern shown in FIG. 10. The photoresist layer 55 is formed on areas, on which only p-impurity diffusion layers are formed, on the device region 54 and the scribe line region 53. On the scribe line region 53, each pattern has a length of 100 μm, a width of 10 μm and an interval of 100 μm. That is, a part of the scribe line region 53 corresponding to the connection region 62 is covered with the photoresist layer 55 as shown in FIG. 11A and the other part corresponding to the connection region 64 is not covered with the photoresist layer 55 as shown in FIG. 11B. At this time, the photoresist layer 55 is removed from the non-usable region 28 of the wafer 22 not to interfere a surface conduction of electric charge.

Next, the n-impurity layer 58 is formed on the p-silicon substrate 50 by an ion implantation of arsenic using the photoresist layer 55 as a mask, whereby, for example, source-drain impurity layers of an n-channel transistor is formed, after the n-impurity layer 58 is heated to be activated. At this time, electric charge generated by the ion implantation is transferred via, especially, the interval region of the photoresist layer 55, that is, part of the substrate on which the photoresist layer 55 is not formed to the periphery portion of the wafer 22 by a surface conduction without an interference of a photoresist. And, the electric charge is flown through a clamp portion of an ion implanting apparatus (not shown) to the outside of the wafer 22.

After that, the photoresist layer 55 is removed from the p-silicon substrate 50, and a photoresist layer for p-impurity (not shown) is formed on the device regions 54. Then, the p-impurity layer 57 is formed on the p-silicon substrate 50 by an ion implantation of boron using the photoresist layer as a mask, whereby, for example, source-drain impurity layers of a p-channel transistor are formed, after the p-impurity layer 57 is heated to be activated.

Next, the BPSG layer 56 is formed on a surface of the substrate thus processed, and the BPSG layer 56 is patterned and removed at the scribe line region 53. After that, the aluminum interconnection layer 60 is formed on the periphery portion of the scribe line region 53. At this time, the aluminum interconnection layer 60 is connected through the p-impurity layer 57 at the connection portion 62 to the p-silicon substrate 50. On the other hand, the aluminum interconnection layer 60 is separated from the p-silicon substrate 50 at the connection portion 64 by P-N junction of the P and N type impurity layers 57 and 58.

In the first preferred embodiment, the order to form the "p" and "n" impurity layers 57 and 58 is not limited as described in the preferred embodiment. That is, the p-impurity layer 57 may be formed before forming of the n-impurity layer 58. Further, impurity materials are not limited as described in the preferred embodiment. Furthermore, the photoresist layer 55 is not limited to have the parallel double-stripes pattern as shown in FIG. 10, that is a single stripe pattern may be used for the photoresist layer 55.

If concentration of n-impurities in source-drain impurity layers of an n-channel transistor is lower than that of p-impurities in source-drain impurity layers of a p-channel transistor, the n-impurity layer 58 can be considered to be a p-impurity layer having a relatively high concentration in a p-silicon substrate. As a result, it is considered that only the p-impurity layer having an impurity concentration higher than that of the p-silicon substrate is formed on the substrate. Consequently, the connection region 64 is not considered to be a separation region in FIG. 9B.

Figure 12:
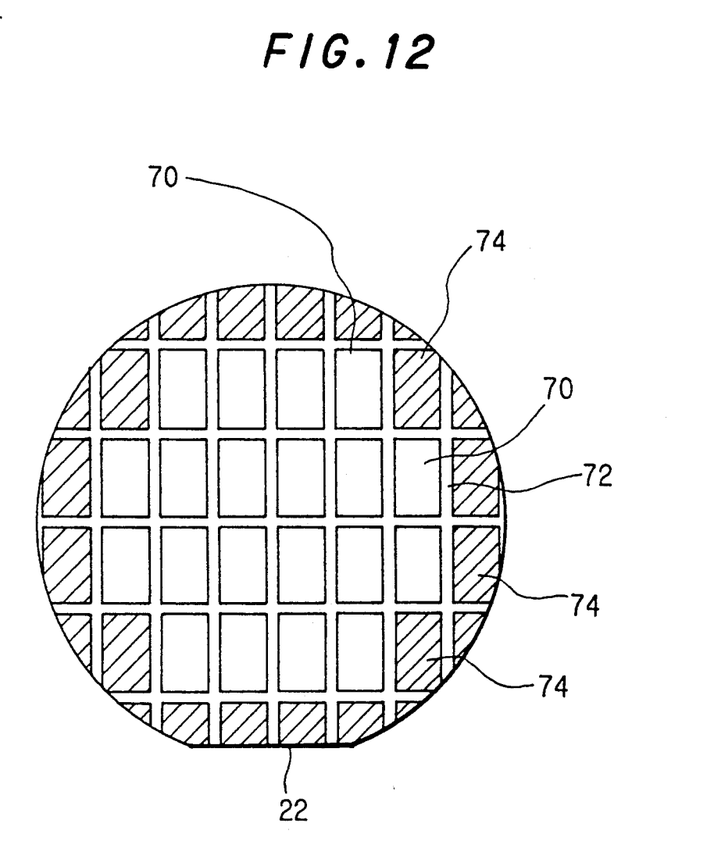
FIG. 12 is a plane view showing a wafer used for a method of a second preferred embodiment according to the invention.

FIG. 12 shows a wafer 22 used for a second preferred embodiment according to the invention. The wafer includes usable device regions 70, non-usable device regions 74, which are located around the usable device regions 70 and are shown with slanting lines, and a scribe line region 72 separating the device regions 70 and 74 each other.

In the second preferred embodiment, it is not necessary that a photoresist layer is removed at the periphery portion having the non-usable device regions 74, because the non-usable device regions 74 are obtained simply by the exposure of the wafer 22 to the semiconductor device pattern. As a result, the fabrication process can be simplified. On the other hand, the wafer 22 is necessary to be exposed at the periphery portion in the first preferred embodiment, so that the photoresist layer is removed at the periphery portion, in case where the photoresist layer is of a positive type.

Although the invention has been described with respect to specific embodiment for complete and clear disclosure, the appended claims are not to be thus limited but are to be construed as embodying all modification and alternative constructions that may be occur to one skilled in the art which fairly fall within the basic teaching herein set forth.

What is claimed is:

1. A method for fabricating semiconductor devices, comprising the steps of:
   defining device regions and scribe line regions on a semiconductor substrate, each of said device regions being surrounded by said scribe line regions;
   providing a photoresist layer on selected areas of said scribe line regions;
   implanting ions into remaining areas of said semiconductor substrate, said remaining areas being not covered with said photoresist layer;
   removing said photoresist layer from said semiconductor substrate; and
   providing an interconnection layer on said scribe line regions, said interconnection layer being in contact via said selected areas with said semiconductor substrate.

2. A method for fabricating semiconductor devices, according to claim 1, wherein:
   said semiconductor substrate is of a first conductivity type; and
   said ions are for an impurity diffusion layer of a second conductivity type.

3. A method for fabricating semiconductor devices, according to claim 2, further comprising the step of:
   implanting ions into said selected areas of said scribe line regions, said ions being for an impurity diffusion layer of said first conductivity type.

4. A method for fabricating semiconductor devices, according to claim 3, wherein:
   said semiconductor substrate is a semiconductor wafer clamped by an ion implantation apparatus, an outer periphery portion of said semiconductor wafer having no photoresist layer in accordance with removal thereof prior to implantation of said ions for said second conductivity type.

5. A method for fabricating semiconductor devices, according to claim 3, wherein:
   said semiconductor substrate is a semiconductor wafer clamped by an ion implantation apparatus, an outer periphery portion of said semiconductor wafer having semiconductor device patterns defined thereon.

6. A method for fabricating semiconductor devices, according to claim 3, wherein:
   said photoresist layer is of stripe patterns arranged in serial on said selected areas of said scribe line regions with a predetermined interval.

7. A method for fabricating semiconductor devices, according to claim 6, wherein:
   each of said stripe pattern is of two parallel stripes.

8. A method for fabricating semiconductor devices, according to claim 3, wherein:
   said semiconductor substrate is of p-type;
   said selected areas of said scribe line regions are of p-type; and
   said remaining areas each includes a n-type upper layer and a p-type lower layer in contact directly with said n-type upper layer.

* * * * *